US012635080B2

(12) United States Patent
Chen et al.

(10) Patent No.: US 12,635,080 B2
(45) Date of Patent: May 19, 2026

(54) WIRE BONDING MACHINE HAVING A ROTATABLE CAPILLARY TO SECURE A BOND WIRE TO A CONNECTION POINT

(71) Applicant: Sandisk Technologies, Inc., Milpitas, CA (US)

(72) Inventors: Jingyun Chen, Shanghai (CN); Fen Yu, Shanghai (CN); Guangqiang Li, Shanghai (CN); Pengchen Ai, Shanghai (CN); Fuqiang Xiao, Shanghai (CN); Shujun Zheng, Shanghai (CN); Yuan Ming, Shanghai (CN); Sizhe Yue, Shanghai (CN); Lian Chen, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 7 days.

(21) Appl. No.: 18/410,668

(22) Filed: Jan. 11, 2024

(65) Prior Publication Data

US 2025/0233102 A1     Jul. 17, 2025

(51) Int. Cl.
| | |
|---|---|
| *B23K 20/00* | (2006.01) |
| *B23K 20/26* | (2006.01) |
| *H05K 3/32* | (2006.01) |
| *B23K 101/42* | (2006.01) |
| *H10W 72/00* | (2026.01) |

(52) U.S. Cl.
CPC ............. *H05K 3/32* (2013.01); *B23K 20/007* (2013.01); *B23K 20/26* (2013.01); *B23K 2101/42* (2018.08); *H05K 2203/049* (2013.01); *H10W 72/07173* (2026.01)

(58) Field of Classification Search
CPC ........... H01L 24/78; H01L 2224/78301; H01L 24/85; H01L 2224/85205; B23K 20/005; B23K 20/004; B23K 20/007; B23K 20/10; B23K 2101/32
See application file for complete search history.

(56) References Cited

U.S. PATENT DOCUMENTS

| | | | | |
|---|---|---|---|---|
| 6,460,751 | B1 | 10/2002 | Thürlemann | |
| 8,357,998 | B2 * | 1/2013 | Huang | ..................... H01L 24/78 |
| | | | | 257/676 |
| 9,793,236 | B2 * | 10/2017 | Sekine | ................. B23K 20/005 |
| 2005/0167473 | A1 * | 8/2005 | Mayer | ..................... H01L 24/78 |
| | | | | 228/180.5 |
| 2009/0045244 | A1 * | 2/2009 | Ou | ........................ B23K 20/004 |
| | | | | 228/101 |
| 2010/0200969 | A1 * | 8/2010 | Huang | .................... H01L 24/48 |
| | | | | 257/690 |

(Continued)

FOREIGN PATENT DOCUMENTS

| | | |
|---|---|---|
| KR | 20070076194 A | 7/2007 |

*Primary Examiner* — Erin B Saad
(74) *Attorney, Agent, or Firm* — DENTONS Durham Jones Pinegar

(57) ABSTRACT

A wire bonder has a rotatable capillary for forming a stitch bond on a bonding surface of a connection point. When the stitch bond is formed, a bond head of the wire bonder causes the capillary to rotate in a XY plane. Rotation of the capillary causes at least a portion of the stitch bond to contact one or more side walls of the connection point. As a result, an entire surface area of the stitch bond contacts one or more surfaces of the connection point.

20 Claims, 6 Drawing Sheets

(56) References Cited

U.S. PATENT DOCUMENTS

| | | | |
|---|---|---|---|
| 2011/0315743 A1* | 12/2011 | Maruya | H01L 24/78 |
| | | | 228/49.5 |
| 2016/0365330 A1* | 12/2016 | Hagiwara | H01L 24/85 |
| 2020/0003968 A1* | 1/2020 | Rolston | G02B 6/428 |
| 2021/0351155 A1* | 11/2021 | Kushima | B23K 20/005 |
| 2023/0360188 A1* | 11/2023 | Cleary | G06N 3/09 |

* cited by examiner

400

410
FORM FIRST BOND ON BOND PAD

420
POSITION CAPILLARY OVER
CONNECTION POINT

430
MOVE CAPILLARY FROM A FIRST
POSITION TOWARD A SECOND
POSITION

440
FROM SECOND BOND ON BONDING
SURFACE OF CONNECTION POINT

450
ROTATE CAPILLARY ABOUT AN AXIS
TO BOND PORTION OF SECOND BOND
TO SIDE WALL

510 — Processing Unit

520 — System Memory

530 — Operating System

540 — Program Modules

550 — Rotation Detection System

500 — Computing Device

560 — Removable Storage

570 — Non-Removable Storage

580 — Communication Systems

585 — Input/Output Devices

590 — Sensor(s)

510 — Other Computing Devices

WIRE BONDING MACHINE HAVING A ROTATABLE CAPILLARY TO SECURE A BOND WIRE TO A CONNECTION POINT

BACKGROUND

Wire bonding is a process in semiconductor packaging in which electrical connections are established between a semiconductor die or an integrated circuit and a connection point on a circuit board or a substrate. During the wire bonding process, a bond wire is fed through a capillary of a wire bonding machine. The capillary is then positioned over a bond pad of the semiconductor die or integrated circuit. A high-voltage electric arc is applied to the bond wire, which causes a ball to be formed at the end of the bond wire. The capillary is then lowered toward the bond pad until the ball contacts the bond pad.

Once the ball is secured to the bond pad, the capillary is then moved and positioned over the connection point on the circuit board or substrate. The capillary is lowered toward the connection point and a second wire bond, referred to as a stitch bond, is formed on the connection point.

As semiconductor packages get smaller and smaller, the pitch between various connection points, and a size of a bonding surface on the connection point, also get smaller. As a result, the stitch bond on the surface of the connection point has a high risk of lifting off of the bonding surface and/or of not fully bonding to the bonding surface. To address this, a second ball or bump is formed on the stitch bond. However, this solution increases the cost and complexity of the semiconductor package fabrication process.

Accordingly, it would be beneficial to reduce the risk of a stitch bond from lifting off of a bonding surface of a connection point without requiring the formation of additional balls or bumps on top of the stitch bond.

SUMMARY

The present application describes a wire bonder (or a wire bonding machine) having a rotatable capillary. In an example, the capillary is rotatable in an XY plane and helps secure or fully bond a stitch bond to a bonding surface of a connection point. For example, when the stitch bond is formed on the bonding surface of the connection point, a bond head of the wire bonder causes the capillary to rotate in the XY plane. As the capillary rotates, at least a portion of the stitch bond and/or at least a portion of the bond wire is bonded to one or more side walls of the connection point. The larger area of the stitch bond reduces the risk of the stitch bond lifting off of the bonding surface of the connection point.

Accordingly, the present disclosure describes a wire bonder that includes a bond head and a capillary. In an example, the bond head causes the capillary to move from a first position to a second position to form a bond on a first surface of a connection point. The bond head also causes the capillary to rotate about an axis to secure at least a portion of the bond to a second surface of the connection point.

The present disclosure also describes a method of forming a bond on a connection point of a printed circuit board (PCB). In an example, the method includes moving a capillary of a wire bonder from a first position to a second position. A bond is formed on a first surface of the connection point of the PCB. When the capillary is in the second position, the capillary is rotated in a XY plane which causes at least a portion of the bond to be coupled to a second surface of the connection point.

Examples also describe a wire bonding means that includes a control means and a bond wire dispensing means. In an example, the control means causes the bond wire dispensing means to move from a first position to a second position to form a bond on a surface of a connection means. The control means also causes the bond wire dispensing means to rotate in a XY plane when the bond wire dispensing means is in the second position.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1A:
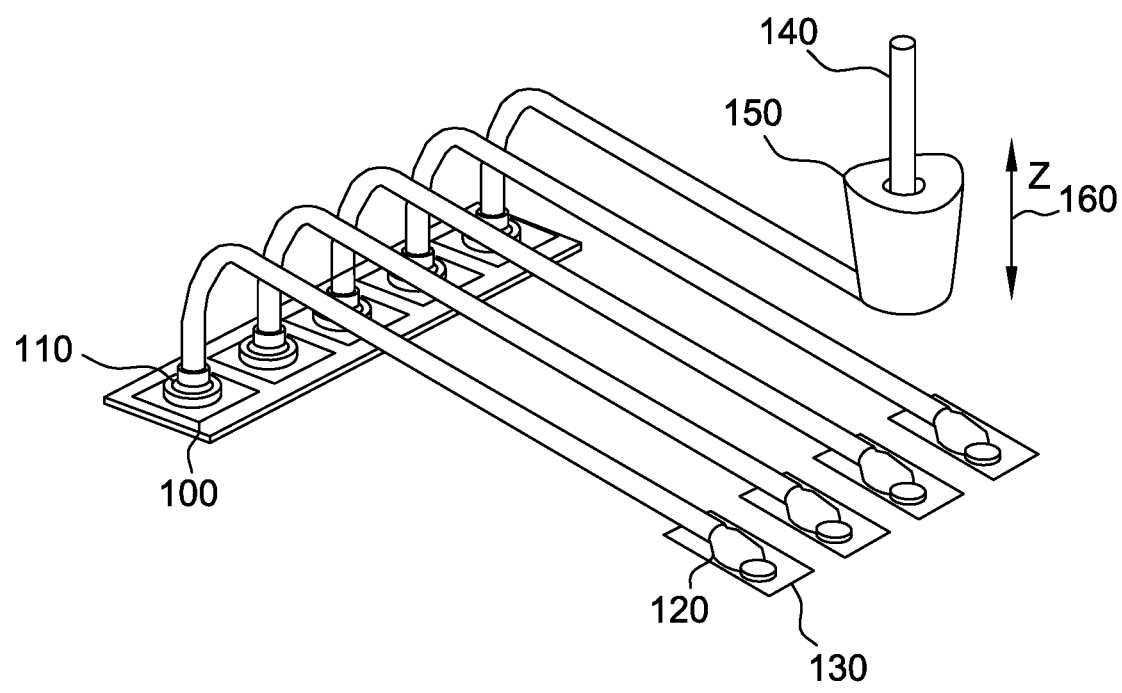
FIG. 1A illustrates the formation of a stitch bond on a connection point using a conventional wire bonder and capillary according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

Wire bonding is a process in semiconductor packaging in which electrical connections are established between a semiconductor die or an integrated circuit and a connection point (also referred to as a "finger") on a circuit board or a substrate. During the wire bonding process, a bond wire is fed through a capillary of a wire bonding machine. The capillary is positioned over a bond pad and a high-voltage electric arc is applied to the bond wire. The electric arc causes a ball to be formed at the end of the bond wire. The capillary is lowered toward the bond pad until the ball at the end of the bond wire contacts the bond pad.

The capillary moves upward and is subsequently positioned over a connection point on the circuit board or substrate. The capillary is then lowered toward the connection point and a second bond, referred to as a stitch bond, is formed on a bonding surface of the connection point. However, as semiconductor packages get smaller, a size of a bonding surface on the connection point also gets smaller. As a result, the stitch bond on the surface of the connection point has a high risk of lifting off of the bonding surface or not fully bonding to the bonding surface.

Current solutions address this by forming a second ball or bump and placing the second ball or bump on or over the stitch bond. However, this solution increases the cost and complexity of the semiconductor package fabrication process.

To address the above, examples described herein are directed to a rotatable capillary for a wire bonder. In an example, the capillary is rotatable about an axis (e.g., in the XY plane) and helps secure or fully bond a stitch bond to a bonding surface of a connection point. For example, when the stitch bond is formed on the bonding surface of the connection point, a bond head of the wire bonder causes the capillary to rotate in the XY plane. As the capillary rotates, at least a portion of the stitch bond is coupled, secured and/or bonded to one or more side walls of the connection point. This forms a larger stitch bond area when compared with current solutions and also reduces the risk of the stitch bond lifting off of the bonding surface of the connection point.

Accordingly, many technical benefits may be realized including, but not limited to, reducing the risk that the stitch bond will lift off of a bonding surface of a connection point and reducing the complexity of the semiconductor fabrication process.

These and other examples will be shown and described in greater detail with respect to FIG. 1A-FIG. 5.

FIG. 1A illustrates the formation of a stitch bond 120 on a connection point 130 using a conventional wire bonder and capillary 150 according to an example. In the example shown, when the stitch bond 120 is formed, the capillary 150 is only moveable in a Z-direction as shown by the bi-directional arrow 160.

During a wire bonding process, a bond wire 140 is provided within a chamfer or channel of the capillary 150. The capillary 150 is positioned over a bond pad 100. A high-voltage electric arc is applied to a portion of the bond wire 140 that extends from the outlet port of the capillary 150 and a ball is formed. The capillary 150 moves downward (e.g., in the Z-direction) toward the bond pad 100.

The ball contacts the bond pad 100 and forms a first bond 110. When the first bond 110 has been formed, the capillary 140 moves upward (e.g., in the Z-direction) and then towards the connection point 130. When the capillary 140 is positioned over the connection point 130, the capillary 150 moves downward (e.g., in the Z-direction) toward the connection point 130 and forms a second bond (or a stitch bond 120) on the connection point 130.

However, as previously discussed, as semiconductor packages get smaller, a bonding surface of the connection point 130 also gets smaller. For example and referring to FIG. 1B, FIG. 1B illustrates a cross-section view of the stitch bond 120 on the connection point 130 of FIG. 1A according to an example.

Figure 1B:
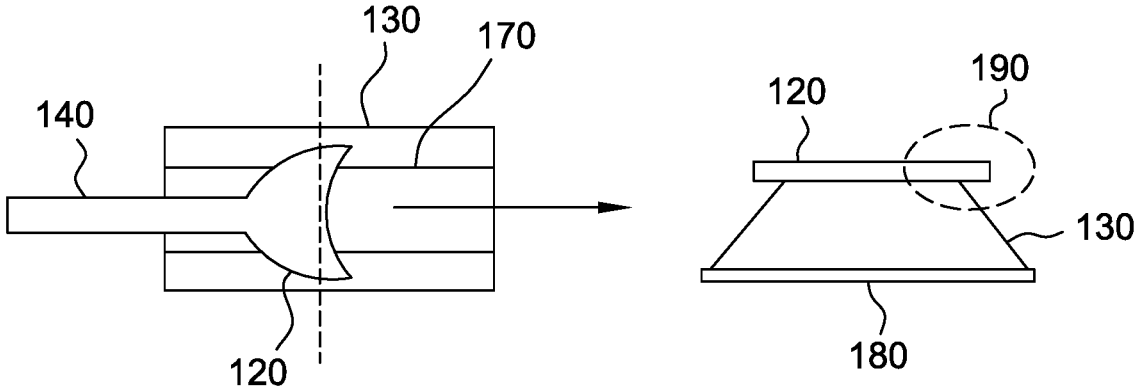
FIG. 1B illustrates a cross-section view of the stitch bond on the connection point of FIG. 1A according to an example.

As shown in FIG. 1B, the connection point 130 is provided on a printed circuit board 180 and has a trapezoid shape. For example, a top surface 170 of the connection point 130 has a first width and the bottom surface of the connection point 130 has a second width. Due to the narrow width of the top surface 170 of the connection point 130, when the stitch bond 120 is formed on the top surface 170 of the connection point 130, a width of the stitch bond 120 exceeds the width of the top surface of the connection point 130. The unbonded portion 190 of the stitch bond 120 increases the risk of a stitch lift (e.g., increases the risk that the stitch bond 120 will lift off of the top surface connection point 130).

Figure 2A:
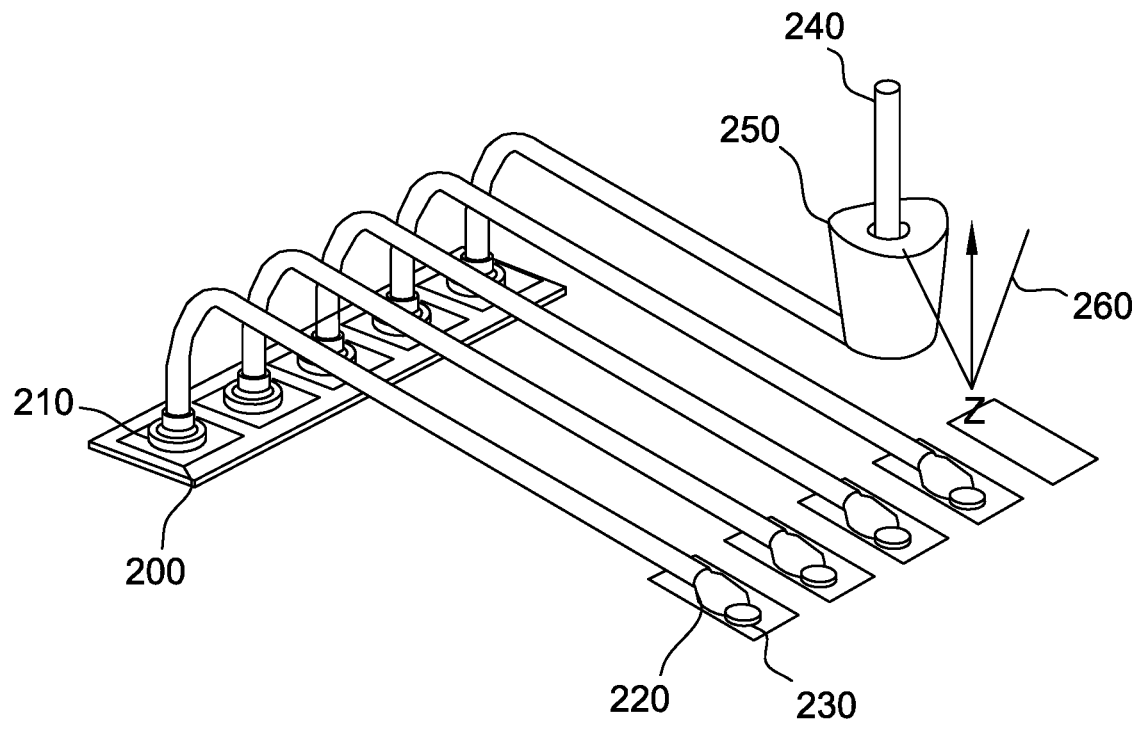
FIG. 2A illustrates the formation of a stitch bond on a connection point using a wire bonder with a rotatable capillary according to an example.

FIG. 2A illustrates the formation of a stitch bond 220 on a connection point 230 using a wire bonder with a rotatable capillary 250 according to an example. In an example, the capillary 250 is moveable in a Z-direction and is rotatable about an axis (e.g., in a XY plane) as shown by the directional arrows 160. However, in an example, the capillary 250 is moveable in the XY plane when the capillary 150 moves from a first position to a second position (e.g., a position in which the stitch bond 220 is formed on the connection point 230).

During a wire bonding process, a bond wire 240 is provided within a chamfer or channel of the capillary 250. A bond head of a wire bonder positions the capillary 250 over a bond pad 200. A high-voltage electric arc is applied to a portion of the bond wire 240 that extends from an outlet port of the capillary 250 and a ball is formed. The bond head moves the capillary 250 downward (e.g., in the Z-direction) toward the bond pad 200.

The ball at the end of the bond wire 240 contacts the bond pad 200 and forms a first bond 210. The bond head moves the capillary 240 upward (e.g., in the Z-direction) and toward the connection point 230. When the capillary 250 is positioned over the connection point 230, the bond head moves the capillary 250 from a first position downward (e.g., in the Z-direction) toward the connection point 230. When the capillary 250 is in a second position, a second bond (or a stitch bond 220) is formed on the connection point 230.

In an example, when the stitch bond 220 is formed on a top surface (also referred to herein as a "bonding surface") of the connection point 230, the capillary 250 is rotated about an axis. For example, a bond head of the wire bonder rotates about an axis which causes the capillary 250 to rotate about an axis (e.g., rotate in the XY plane as shown by the bi-directional arrow 260). As the capillary 250 rotates, the capillary squishes or squeezes any overhanging portion of the stitch bond 200 to couple or bond the overhanging portion to a side wall of the connection point 230.

In an example, the rotation of the capillary 250 is bi-directional in the XY plane. For example, when the stitch bond 220 is formed on the connection point 230, the capillary 250 is rotatable in a first direction in the XY plane and in a second direction in the XY plane (e.g., opposite from the first direction). This helps ensure that any overhanging portion of the stitch bond is securely coupled to one or more sidewalls of the connection point 230.

In an example, when the capillary 250 has been rotated in the XY plane, the capillary 250 is returned to its original orientation in the XY plane and moved upward/away from the connection point 230. The process is then repeated for a second bond pad 200 and associated connection point 230.

Figure 2B:
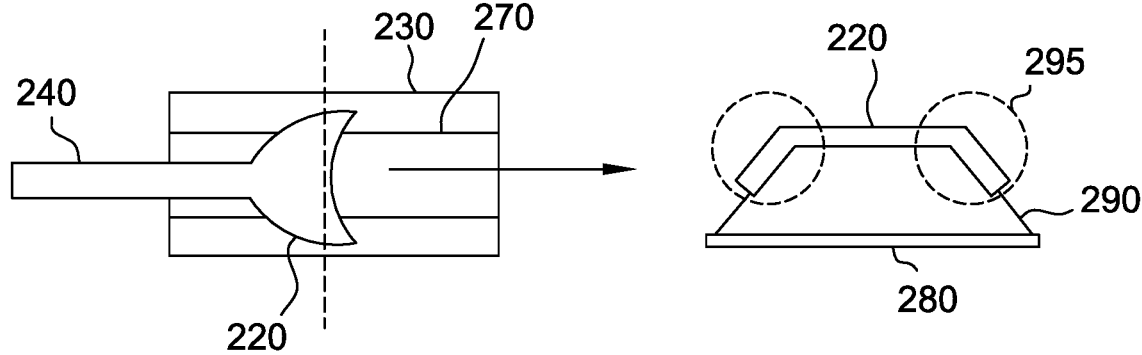
FIG. 2B illustrates a cross-section view of the stitch bond on the connection point of FIG. 2A according to an example.

FIG. 2B illustrates a cross-section view of the stitch bond 220 on the connection point 230 of FIG. 2A according to an example. In an example, the connection point 230 is provided on a PCB 280. In an example, the PCB includes a substrate with one or more connection points 230. In an example, the connection point 230 has a trapezoid shape. For example, a top surface 270 (also referred to as a bonding surface) of the connection point 230 has a first width and the bottom surface of the connection point 230 has a second width. Although a trapezoid shape is specifically mentioned, the connection point 230 may have any number of shapes.

In an example, when the stitch bond 220 is formed on the top surface 270 of the connection point 230, the capillary 250 (FIG. 2B) is rotated about an axis (e.g., in the XY plane) in a first direction and/or a second direction. Rotation of the capillary 250 causes any overhanging portion 295 of the stitch bond 220 to be secured or otherwise coupled to a side wall 290 of the connection point 220. As a result, the entire surface area of the stitch bond 220 is coupled and/or bonded to a surface area (e.g., a bonding/top surface and/or one or more side walls) of the connection point 230. Because the entire surface area of the stitch bond 220 is bonded to a surface, the risk of the stitch bond 220 lifting off of the bonding surface 270 and/or the connection point 230 is reduced when compared with current solutions.

Figure 3A:
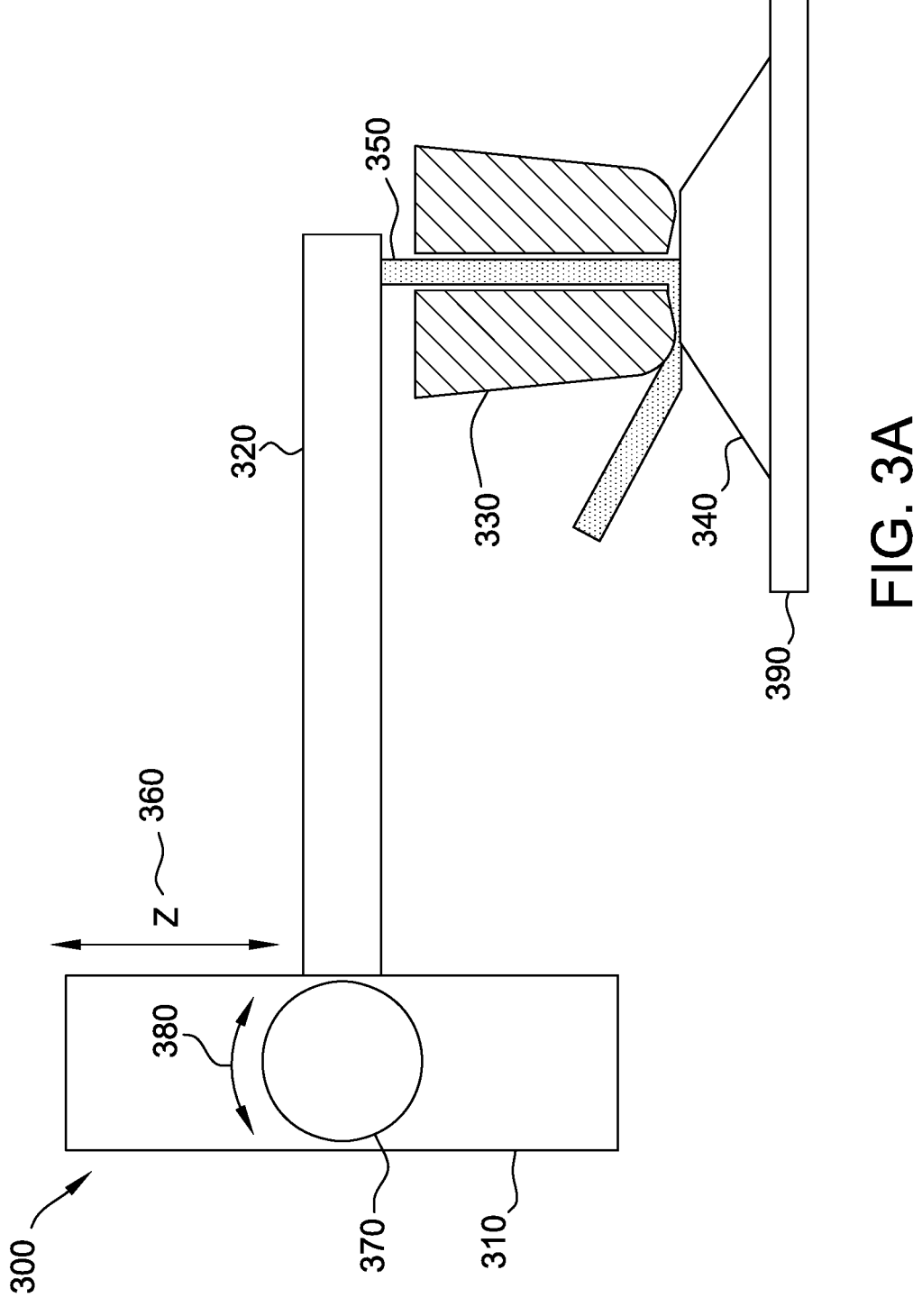
FIG. 3A illustrates a wire bonder having a rotatable capillary according to an example.

FIG. 3A illustrates a wire bonder 300 having a rotatable capillary 330 according to an example. In an example, the wire bonder 300 and capillary 330 may be similar to the wire bonder and capillary 250 shown and described with respect to FIG. 2A. For example, a bond wire 350 is provided within a chamfer defined by the capillary 330. In an example, a portion of the bond wire 350 at least partially extends from an outlet port of the capillary 330 during a wire bonding process.

The wire bonder 300 includes a bond head 310 and a transducer 320. The transducer 320 is coupled to the bond head 310. In an example, the transducer 320 is an ultrasonic transducer, although any type of transducer 320 may be used. The wire bonder 300 also includes the capillary 330. In an example, the capillary 330 is coupled to the transducer 320.

In an example, movement of the transducer 320 and/or the capillary 330 is controlled by the bond head 310. For example, during the wire bonding process, the bond head 310 moves in a particular direction (or directions) to position the capillary 330 over a particular bond pad (e.g., the bond pad 200 (FIG. 2A)). The bond head 310 moves downward (e.g., in a Z-direction represented by the bi-directional arrow 360) which causes the capillary 330 to move downward. The bond wire 350 is then used to create a first bond on the bond pad.

When the first bond is formed, the bond head 310 moves upward (e.g., in the Z-direction) or away from the bond pad and positions the capillary 330 above the connection point 340. In an example, the connection point 340 is coupled to, or is otherwise associated with, a PCB 390. The bond head 310 moves downward (e.g., in the Z-direction) from a first position to a second position. Likewise, the capillary 330 moves from a first position toward a second position (e.g., toward a top surface, or bonding surface, of the connection point 340). When the bond wire 350 and/or the capillary 330 contacts the top surface of the connection point 340, a second bond (or a stitch bond) is formed.

In an example, when the capillary 330 is in the second position, the bond head 310 causes the capillary 330 to rotate about an axis (represented by the bi-directional arrows 380). In an example, the rotation of the capillary 330 occurs in the XY plane. In one example, the bond head 310 is rotatable which causes the capillary 330 to rotate.

For example, the bond head 310 includes a rotation mechanism 370. The rotation mechanism 370 causes the bond head 310 to rotate about an axis which also causes the capillary 330 to rotate about an axis. In another example, the capillary 330 and/or the transducer 320 include a rotation mechanism that causes the transducer 320 and/or the capillary 330 to rotate about an axis separate from the bond head 310.

Figure 3B:
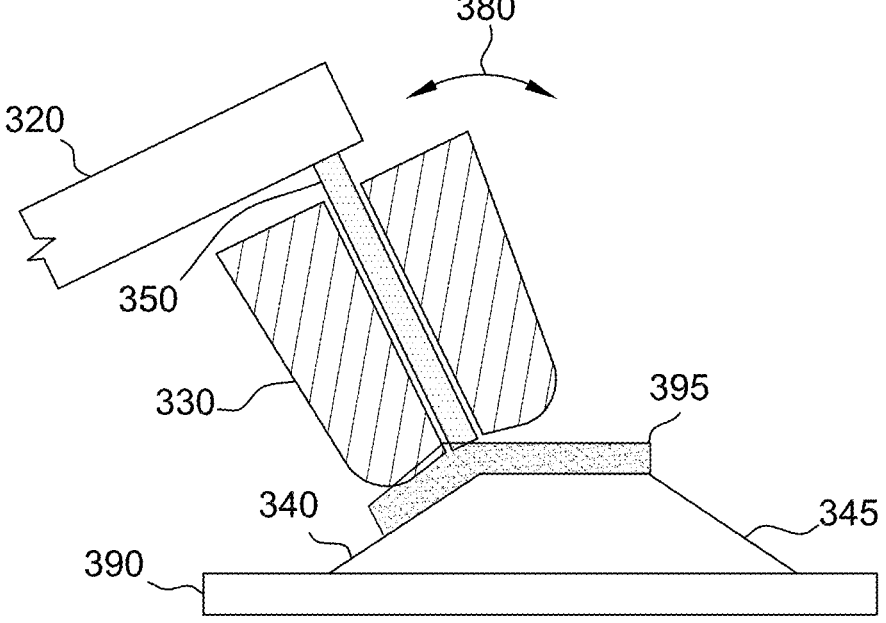
FIG. 3B illustrates how the capillary is rotatable when forming a stitch bond on a connection point according to an example.

FIG. 3B illustrates how the capillary 330 is rotatable when forming a stitch bond 395 on a connection point 340 according to an example. As shown in FIG. 3B, when the capillary 330 is moved from the first position to/toward the second position (e.g., a position in which the stitch bond 395 is formed on a top surface or bonding surface of the connection point 340), the capillary 330 is rotated in a first direction in the XY plane.

Rotation of the capillary 330 in the first direction causes at least a portion of the bond wire 350 and/or the stitch bond 395 to contact and be bonded/coupled to a side wall 345 of the connection point 340. In an example, the capillary 330 is also rotatable in a second direction (e.g., a direction that is opposite the first direction) which causes another portion of the bond wire 350 and/or another portion of the stitch bond 395 to be bonded and/or coupled to the side wall 345 of the connection point 340.

Figure 4:
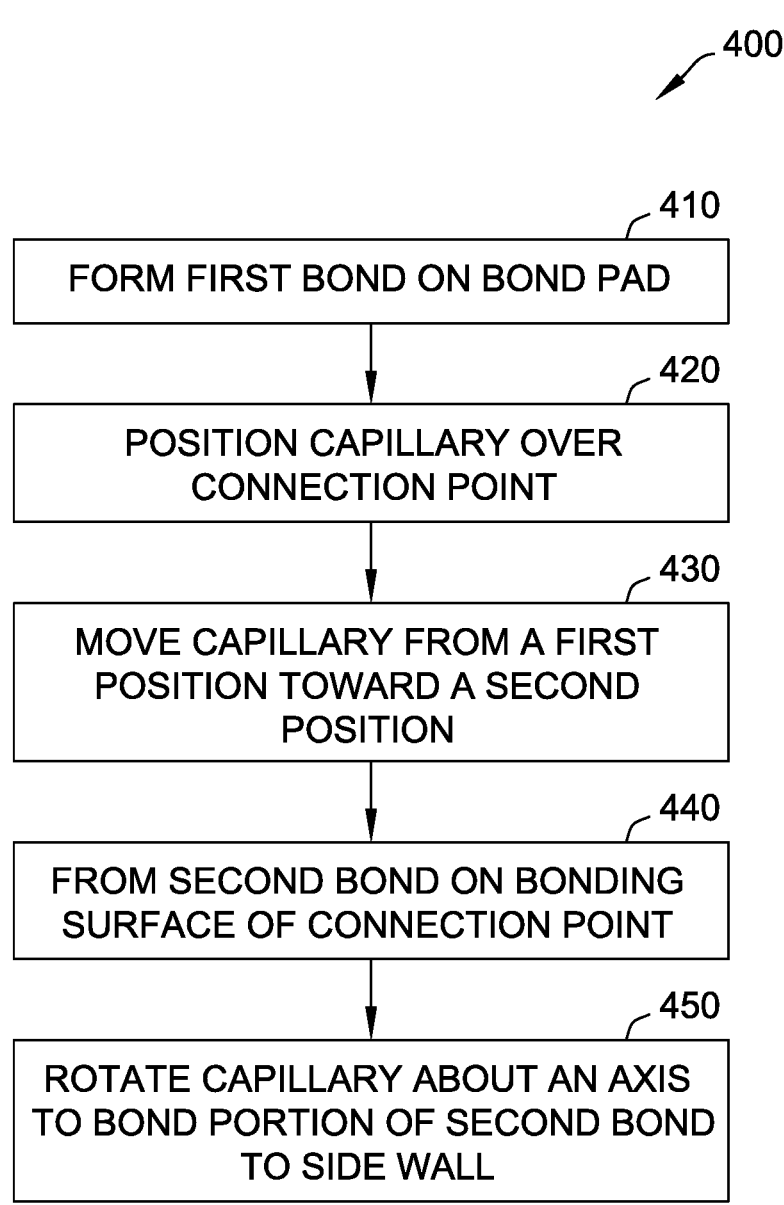
FIG. 4 illustrates a method for forming a bond on a connection point according to an example.

FIG. 4 illustrates a method 400 for forming a bond on a connection point according to an example. In an example, the method 400 is performed by a wire bonder such as, for example, the wire bonder 300 shown and described with respect to FIG. 3A.

Method 400 begins when a first bond is formed (410) on a bond pad. When the first bond is formed, a bond head of the wire bonder positions (420) a capillary over a connection point associated with the bond pad. When the capillary is positioned over the connection point, the bond head causes the capillary to move (430) from a first position to a second position.

When in the second position, a bond wire extending from the capillary is used to form (440) a second bond on a bonding surface of the connection point. When the second bond has been formed, the bond head causes the capillary to rotate (450) about an axis. In an example, the rotation of the capillary is achieved by a rotation mechanism associated with the bond head.

For example, the rotation mechanism rotates with bond head. As the bond head rotates, so does the capillary. In another example, the capillary includes a rotation mechanism. As such, the capillary is separately rotatable from the bond head.

In an example, as the capillary rotates, an outer surface of the capillary squeezes at least a portion of the stitch bond and secures the at least the portion to a side wall of the connection point. The capillary may also rotate in another direction which causes another portion of the stitch bond to be coupled or bonded to another sidewall of the connection point.

After the rotation is complete, the bond head returns to its original orientation/position (e.g., the position and/or orientation it had prior to rotating the capillary). The method 400 is then repeated for other bond pads and associated connection points.

Figure 5:
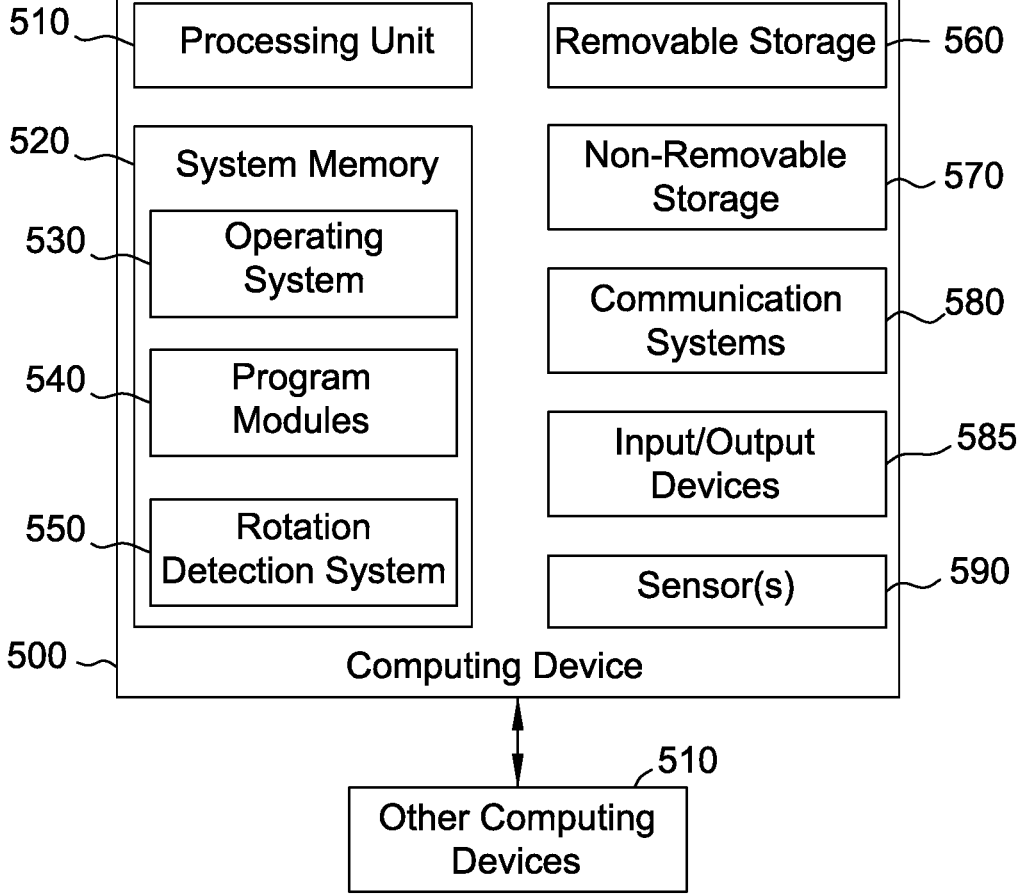
FIG. 5 is a system diagram of a computing device according to an example.

FIG. 5 is a system diagram of a computing device 500 according to an example. The computing device 500, or various components and systems of the computing device 500, may be integrated or associated with a wire bonding machine or device that includes the capillary shown and described with respect to the various examples described herein. For example, the computing device 500, or various components or systems of the computing device 500 may be used to rotate a bond head and/or capillary of the wire bonding machine during a wire bonding process.

As shown in FIG. 5, the physical components (e.g., hardware) of the computing device are illustrated and these physical components may be used to practice the various aspects of the present disclosure. In addition to the various components shown in FIG. 5, the computing device 500 may also include, or otherwise be associated with the wire bonder 300 shown and described with respect to FIG. 3A.

The computing device 500 includes at least one processing unit 510 and a system memory 520. The system memory 520 may include, but is not limited to, volatile storage (e.g., random access memory), non-volatile storage (e.g., read-only memory), flash memory, or any combination of such memories. The system memory 520 also includes an operating system 530 that controls the operation of the computing device 500 and one or more program modules 540. The program modules 540 are responsible for executing one or more steps of a wire bonding process including, but not limited to, monitoring and/or controlling rotation of the bond head and/or the capillary. The program modules 540 may also communicate with a rotation detection system 550 that is responsible for monitoring and/or controlling the rotation of the bond head and/or the capillary. While being executed by the processing unit 510, the program modules 540 may perform the various processes described above.

The computing device 500 may also have additional features or functionality. For example, the computing device 500 may include additional data storage devices (e.g., removable and/or non-removable storage devices) such as, for example, magnetic disks, optical disks, or tape. These additional storage devices are labeled as a removable storage 560 and a non-removable storage 570.

Examples of the disclosure may also be practiced in an electrical circuit comprising discrete electronic elements, packaged or integrated electronic chips containing logic gates, a circuit utilizing a microprocessor, or on a single chip containing electronic elements or microprocessors. For example, examples of the disclosure may be practiced via a system-on-a-chip (SOC) where each or many of the components illustrated in FIG. 5 may be integrated onto a single integrated circuit. Such a SOC device may include one or more processing units, graphics units, communications units, system virtualization units and various application functionality all of which are integrated (or "burned") onto the chip substrate as a single integrated circuit.

When operating via a SOC, the functionality, described herein, may be operated via application-specific logic integrated with other components of the computing device 500 on the single integrated circuit (chip). The disclosure may also be practiced using other technologies capable of performing logical operations such as, for example, AND, OR, and NOT, including but not limited to, mechanical, optical, fluidic, and quantum technologies.

The computing device 500 may include one or more communication systems 580 that enable the computing device 500 to communicate with other computing devices 595 or systems. Examples of communication systems 580 include, but are not limited to, wireless communications, wired communications, cellular communications, radio frequency (RF) transmitter, receiver, and/or transceiver circuitry, a Controller Area Network (CAN) bus, a universal serial bus (USB), parallel, serial ports, etc.

The computing device 500 may also have one or more input devices and/or one or more output devices shown as input/output devices 585. These input/output devices 585 may include a keyboard, a sound or voice input device, haptic devices, a touch, force and/or swipe input device, a display, speakers, etc. The aforementioned devices are examples and others may be used.

The computing device 500 may also include one or more sensors 590. The sensors may be image sensors that are used to detect the size parameters of a bond pad, whether the diameter of the chamfer of the capillary has reached (or is still has) a desired diameter and/or how much and for how long a stimulant is to be applied to the shape memory material of the capillary.

The term computer-readable media as used herein may include computer storage media. Computer storage media may include volatile and nonvolatile, removable and non-removable media implemented in any method or technology for storage of information, such as computer readable instructions, data structures, or program modules.

The system memory 520, the removable storage 560, and the non-removable storage 570 are all computer storage media examples (e.g., memory storage). Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing device 500. Any such computer storage media may be part of the computing device 500. Computer storage media does not include a carrier wave or other propagated or modulated data signal.

Examples of the present disclosure describe a wire bonder, comprising: a bond head; and a capillary; wherein the bond head causes the capillary to move from a first position to a second position to form a bond on a first surface of a connection point; and wherein the bond head causes the capillary to rotate about an axis to secure at least a portion of the bond to a second surface of the connection point. In an example, the second surface is a side wall of the connection point. In an example, a surface area of the bond is greater than a surface area of the first surface and wherein rotation of the capillary causes the at least the portion of the bond to be secured to the second surface of the connection point. In an example, the bond head causes the capillary to rotate about the axis in a first direction and a second direction. In an example, the rotation about the axis in the first direction causes the at least the portion of the bond to be secured to the second surface and wherein rotation about the axis in the second direction causes at least another portion of the bond to be secured to a third surface. In an example, the third surface is a side wall of the connection point. In an example, the bond is a stitch bond.

Examples also describe a method of forming a bond on a connection point of a printed circuit board (PCB), comprising: moving a capillary of a wire bonder from a first position to a second position; forming a bond on a first surface of the connection point of the PCB; and when the capillary is in the second position, rotating the capillary in a XY plane to cause at least a portion of the bond to be coupled to a second surface of the connection point. In an example, the second surface is a side wall of the connection point. In an example, a surface area of the bond is greater than a surface area of the first surface and wherein rotating the capillary in the XY plane causes the at least the portion of the bond to be secured to the second surface of the connection point. In an example, a bond head of the wire bonder causes the capillary to rotate in the XY plane in a first direction and a second direction. In an example, the rotation in the XY plane causes the at least the portion of the bond to be coupled to the second surface and wherein rotation in the XY plane causes at least another portion of the bond to be coupled to a third surface. In an example, the third surface is a side wall of the connection point. In an example, the bond is a stitch bond.

Additional examples describe a wire bonding means, comprising: a control means; and a bond wire dispensing means; wherein the control means causes the bond wire dispensing means to move from a first position to a second position to form a bond on a surface of a connection means; and wherein the control means causes the bond wire dispensing means to rotate in a XY plane when the bond wire dispensing means is in the second position. In an example, the surface of the connection means is a first surface and wherein rotation of the wire dispensing means causes at least a portion of the bond to be coupled to a second a second surface of the connection means. In an example, a surface area of the bond is greater than a surface area of the first surface and wherein rotation of the wire dispensing means causes the at least the portion of the bond to be secured to the second surface of the connection means. In an example, the control means causes the bond wire dispensing means to rotate in the XY plane in a first direction and a second direction. In an example, the surface of the connection means is a first surface and wherein the rotation in the XY plane in the first direction causes at least a first portion of the bond to be coupled to a second surface of the connection means and wherein rotation in the XY plane in the second direction causes at least a second portion of the bond to be coupled to a third surface of the connection means. In an example, the bond is a stitch bond.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/ or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks. Additionally, it is contemplated that the flowcharts and/or aspects of the flowcharts may be combined and/or performed in any order.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A wire bonder, comprising:
a controller executing one or more instructions and causing:
  a bond head to move a capillary from a first position to a second position that is lower than the first position when forming a bond on a first surface of a connection point; and
  a rotation mechanism to rotate at least one of the bond head and the capillary about an axis when the capillary is in the second position, the rotation of the at least one of the bond head and the capillary securing at least a portion of the bond to a second surface of the connection point.

2. The wire bonder of claim 1, wherein the second surface is a side wall of the connection point.

3. The wire bonder of claim 1, wherein a surface area of the bond is greater than a surface area of the first surface.

4. The wire bonder of claim 1, wherein the rotation about the axis occurs in both a first direction and a second direction.

5. The wire bonder of claim 4, wherein the rotation about the axis in the first direction causes the at least the portion of the bond to be secured to the second surface of the connection point and wherein rotation about the axis in the second direction causes at least another portion of the bond to be secured to a third surface of the connection point.

6. The wire bonder of claim 5, wherein the third surface is a side wall of the connection point.

7. The wire bonder of claim 1, wherein the bond is a stitch bond.

8. A method of forming a bond on a connection point of a printed circuit board (PCB), comprising:
  causing, in response to a first instruction executed by a controller of a wire bonding machine, a bond head of the wire bonding machine to move a capillary of the wire bonding machine from a first position to a second position that is below the first position;
  forming a first portion of a bond on a first surface of the connection point of the PCB when the capillary is in the second position; and
  causing, in response to a second instruction executed by the controller of the wire bonding machine, a rotation mechanism of the wire bonding machine to rotate the capillary about an axis to form a second portion of the bond on a second surface of the connection point.

9. The method of claim 8, wherein the second surface is a side wall of the connection point.

10. The method of claim 8, wherein the rotation about the axis is in a first direction and a second direction.

11. The method of claim 10, wherein the rotation about the axis causes a third portion of the bond to be coupled to a third surface of the connection point.

12. The method of claim 11, wherein the third surface is a side wall of the connection point.

13. The method of claim 8, wherein the bond is a stitch bond.

14. A wire bonding means, comprising:
a bond wire dispensing means; and
a control means that executes one or more instructions, the execution of which:
   causes movement of the bond wire dispensing means from a first position to a second position that is lower than the first position to form a bond on a first surface of a connection means; and
   causes a rotation means to rotate the bond wire dispensing means in a XY plane when the bond wire dispensing means is in the second position, wherein the rotation of the bond wire dispensing means in the XY plane secures at least a portion of the bond to a second surface of the connection means.

15. The wire bonding means of claim 14, wherein a surface area of the bond is greater than a surface area of the first surface of the connection means.

16. The wire bonding means of claim 14, wherein the rotation in the XY plane is in a first direction and a second direction.

17. The wire bonding means of claim 16, wherein the rotation in the XY plane in the first direction causes the at least the first portion of the bond to be coupled to the second surface of the connection means and wherein rotation in the XY plane in the second direction causes at least a second portion of the bond to be coupled to a third surface of the connection means.

18. The wire bonding means of claim 14, wherein the bond is a stitch bond.

19. The wire bonding means of claim 14, wherein the bond on the first surface of the connection means comprises an overhang.

20. The wire bonding means of claim 14, wherein after rotation in the XY plane, the control means is further configured to return the bond wire dispensing means to its original orientation prior to moving the bond wire dispensing means away from the connection means.

* * * * *